United States Patent
Kim et al.

(10) Patent No.: US 7,493,533 B2
(45) Date of Patent: Feb. 17, 2009

(54) DELAY DETECTING APPARATUS OF DELAY ELEMENT IN SEMICONDUCTOR DEVICE AND METHOD THEREOF

(75) Inventors: Tae-Yun Kim, Ichon-shi (KR); Hwang Hur, Ichon-shi (KR); Jun-Gi Choi, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 449 days.

(21) Appl. No.: 11/017,646

(22) Filed: Dec. 22, 2004

(65) Prior Publication Data

US 2005/0229051 A1  Oct. 13, 2005

(30) Foreign Application Priority Data

Apr. 8, 2004  (KR)  .................. 10-2004-0024031

(51) Int. Cl.
 *G11C 29/00*  (2006.01)
(52) U.S. Cl. ...................... 714/718; 714/724
(58) Field of Classification Search .......... 714/100–824
 See application file for complete search history.

(56) References Cited

U.S. PATENT DOCUMENTS

| | | | | |
|---|---|---|---|---|
| 5,272,729 A * | 12/1993 | Bechade et al. | ............. | 375/371 |
| 5,309,111 A * | 5/1994 | McNeely et al. | ................ | 327/7 |
| 5,357,480 A * | 10/1994 | Vinal | .................... | 365/233.5 |
| 5,822,228 A * | 10/1998 | Irrinki et al. | ................. | 714/718 |
| 5,995,441 A * | 11/1999 | Kato et al. | ................... | 365/194 |
| 6,069,506 A * | 5/2000 | Miller et al. | ................. | 327/156 |
| 6,072,345 A * | 6/2000 | Ooishi | ......................... | 327/157 |
| 6,158,030 A | 12/2000 | Reichle et al. | | |
| 6,178,123 B1 * | 1/2001 | Kato et al. | ................... | 365/194 |
| 6,222,792 B1 * | 4/2001 | Hanzawa et al. | ............. | 365/233 |
| 6,262,938 B1 * | 7/2001 | Lee et al. | .............. | 365/233.12 |
| 6,351,167 B1 * | 2/2002 | Hein et al. | ................... | 327/158 |
| 6,424,583 B1 * | 7/2002 | Sung et al. | ................... | 365/201 |
| 6,470,468 B1 * | 10/2002 | Fukui | ........................ | 714/744 |
| 6,636,979 B1 * | 10/2003 | Reddy et al. | ................ | 713/503 |
| 6,708,139 B2 * | 3/2004 | Rearick et al. | ............. | 702/185 |
| 6,839,301 B2 * | 1/2005 | Lin et al. | ............... | 365/233.12 |
| 6,868,020 B2 | 3/2005 | Aoki | | |
| 6,871,306 B2 | 3/2005 | Ernst et al. | | |
| 7,024,326 B2 * | 4/2006 | Nygren | ........................ | 702/89 |
| 7,078,951 B2 * | 7/2006 | Gomm et al. | ............... | 327/261 |
| 7,111,185 B2 * | 9/2006 | Gomm et al. | ............... | 713/401 |
| 7,149,903 B1 * | 12/2006 | Chan et al. | ................... | 713/300 |
| 2002/0041538 A1 * | 4/2002 | Hayashi | ...................... | 368/121 |

(Continued)

FOREIGN PATENT DOCUMENTS

JP  2002-042498  2/2002

*Primary Examiner*—Cynthia Britt
*Assistant Examiner*—Guerrier Merant
(74) *Attorney, Agent, or Firm*—Lowe Hauptman Ham & Berner, LLP

(57) ABSTRACT

A delay detecting apparatus detects delay amounts of delay elements in a semiconductor device by using a test mode. The semiconductor device comprises a delay signal detecting unit for detecting delays of delay elements in the semiconductor device by using a signal that is synchronized with an external clock, and a delay signal outputting unit for outputting a delayed signal from the delay signal detecting unit to a data pad by using the signal that is synchronized with the external clock.

10 Claims, 4 Drawing Sheets

U.S. PATENT DOCUMENTS

| | | | |
|---|---|---|---|
| 2002/0075740 A1* | 6/2002 | Sung et al. | 365/201 |
| 2002/0124218 A1* | 9/2002 | Kishimoto | 714/738 |
| 2002/0180500 A1* | 12/2002 | Okuda et al. | 327/158 |
| 2002/0181296 A1* | 12/2002 | Jones et al. | 365/194 |
| 2004/0213051 A1* | 10/2004 | Lin et al. | 365/194 |
| 2005/0022094 A1* | 1/2005 | Mudge et al. | 714/758 |
| 2005/0216799 A1* | 9/2005 | Azimane | 714/718 |
| 2005/0246596 A1* | 11/2005 | Chen et al. | 714/700 |
| 2006/0018171 A1* | 1/2006 | Austin et al. | 365/205 |
| 2006/0265622 A1* | 11/2006 | Gomm et al. | 713/400 |

* cited by examiner

DELAY DETECTING APPARATUS OF DELAY ELEMENT IN SEMICONDUCTOR DEVICE AND METHOD THEREOF

FIELD OF INVENTION

The present invention relates to a semiconductor memory device; and, more particularly, to an apparatus for detecting delay amounts of delay elements that generate delays in a semiconductor memory device.

DESCRIPTION OF PRIOR ART

It becomes more difficult to check if a delay of each element in a semiconductor memory device is equal to a value that is obtained by a simulation, as the semiconductor memory device has been developed continuously to have smaller size. Actually, during the initial development period of the semiconductor memory device, it becomes more difficult to perform the simulation for the delay of each delay element with taking account for process variation, temperature variation and voltage variation and so on.

As there is a need for a fine manufacturing technique of the semiconductor memory device, the delay of each element in the semiconductor memory device can have variables that cannot be expected with regard to the range of process variation, temperature variation and voltage variation. Further, those variables may be different from the delays that are obtained during the simulation in device design, which makes it difficult to expect the delay variation range.

However, there has been no way of detecting such delays case by case, if any, it cannot yield accurate values. Further, because data obtained after some processes for several cases are performed should be collected, compared and analyzed when the delay variation is not detected accurately in a problematic case, it is very difficult to resolve that problem or it takes so long time to resolve that problem.

SUMMARY OF INVENTION

It is, therefore, an object of the present invention to provide an apparatus for detecting delay amounts of delay elements in a semiconductor device and a method thereof.

It is another object of the present invention to provide an apparatus for detecting delay amounts of delay elements in a semiconductor device by using a test mode and a method thereof.

In accordance with an aspect of the present invention, there is provided a semiconductor device comprising a delay signal detecting unit for detecting delays of delay elements in the semiconductor device by using a signal that is synchronized with an external clock; and a delay signal outputting unit for outputting a delayed signal from the delay signal detecting unit to a data pad by using the signal that is synchronized with the external clock.

Desirably, the delay signal detecting unit includes a test mode signal generating unit for receiving a command signal, an address signal and a pulse clock that is synchronized with the clock to generate a plurality of test mode signal; a delay detecting target having one or more delay elements; and a switching/latching unit for controlling output of the delayed signals that are outputted from the delay detecting target by using one of the plurality of the test mode signals.

On the other hand, the plurality of test mode signals includes an input test mode signal that is inputted to the delay detecting target; a switching test mode signal for controlling the switching/latching means; and an output test mode signal for controlling the delay signal outputting unit, the input test mode signal, the switching test mode signal and the output test mode signal are generated in synchronization with a pulse clock, the pulse clock is synchronized with the external clock.

Further, the switching/latching unit includes a transfer gate for transferring an input test mode delayed signal under control of the switching test mode signal, the input test mode delayed signal is generated by passing the input test mode signal through the delay detecting target; and a latch for latching the output of the transfer gate.

Further, the input test mode signal is activated in response to the first pulse clock while the switching test mode signal is activated in response to the second or later pulse clock, and the interval between the first pulse clock and the second or later pulse clock can be increased or decreased.

In accordance with another aspect of the present invention, there is provided a method for detecting delays of delay elements in a semiconductor device, comprising the steps of: (a) detecting delay signals that are generated by the delay elements in the semiconductor device by using a signal that is synchronized with an external clock; and (b) outputting the delayed signals that are detected in the detecting step to a data pad by using the signal that is synchronized with the external clock.

Desirably, the step (a) includes the steps of: generating a plurality of test mode signals after receiving a command signal, an address signal and a pulse clock that is synchronized with the clock, the plurality of the test mode signals including an input test mode signal, a switching test mode signal and an output test mode signal; outputting input test mode delayed signals that are generated by pass the input test mode signal through the delay elements; and controlling the output of the input test mode delayed signals by using the switching test mode signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

In the present invention, by constructing delay elements that delay a clock used within a semiconductor memory device, separately in the semiconductor memory device, and detecting separately the delay amounts of the delay elements by using a test mode signal and the clock, the delay amount variation may be obtained for process, voltage and temperature variation and so on.

The present invention is characterized by detecting the delay amounts by arranging the delay elements for which delay amounts are to be obtained, within the semiconductor device, and transferring the test mode signal, for measuring the delay amounts, in synchronization with the clock to a data output pad DQ PAD through which data is inputted and outputted, after delaying the test mode signal with a predetermined delay time. That is, the delay time of the targeted delay element is the time between the input test mode signal and a switching test mode signal that are outputted from a test mode signal generating unit when the data pad has "H" state.

Hereinafter, a preferred embodiment in accordance with the present invention will be described in detail with reference to the accompanying drawings. The terminology in the present specification and the accompanying claims should not be construed in limiting sense but should be understood as meaning and concepts within the spirit of the present invention under the principle that the inventor may properly define the concept of the terminology to describe the present invention in the best way. Accordingly, various modifications or equivalents of the described embodiments that are apparent to persons skilled in the art are deemed to lie within the spirit and scope of the invention.

Figure 1:
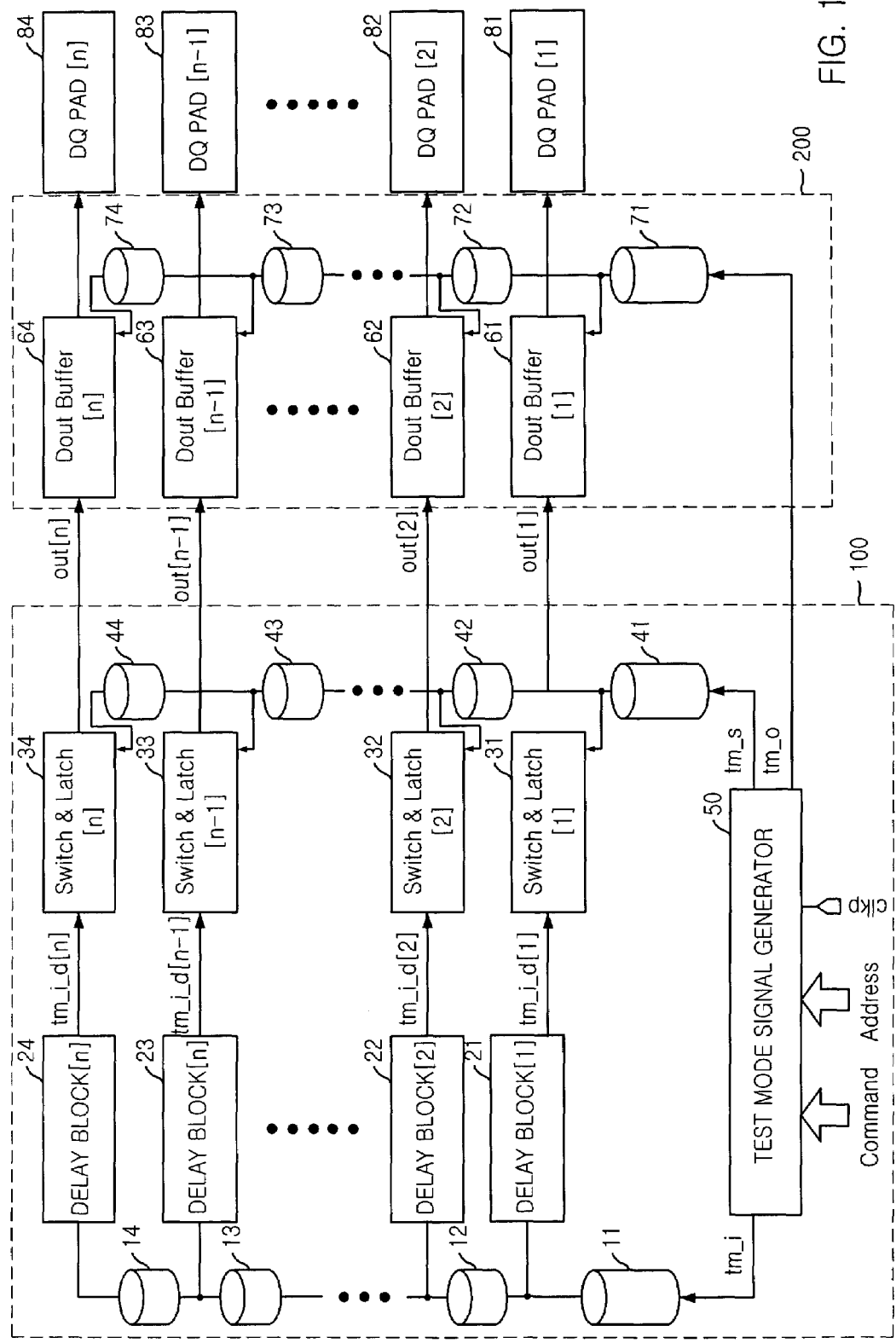
FIG. 1 is a block diagram showing an embodiment of a delay detecting apparatus for delay elements in accordance with the present invention.

FIG. 1 is a block diagram showing an embodiment of a delay detecting apparatus of delay elements in accordance with the present invention.

The delay detecting apparatus for delay elements of the present invention comprises a delay signal passing means 100 for passing a delay signal through for each delay element by using a signal that is synchronized with a clock, and a delay signal outputting means 200 for outputting the passed delay signal to a data pad DQ PAD.

The delay signal passing means 100 includes a test mode signal generating unit 50, delay detecting target units 21-24, switching/latching units 31-34, and pipelines 11-14, 41-44, and 71-74. The test mode signals generating unit 50 receives a command Command, an address Address and a pulse clock clkp for generating test mode signals to output an input test mode signal tm_i, an switching test mode signal tm_s and an output test mode signal tm_o. Here, the address may be assigned for each delay element for which the delay is to be detected.

The input test mode signal tm_i that is inputted to each of the delay detecting target units 21, . . . , 24 is a reference signal for detecting the delays of the delay elements. The input test mode signal tm_i is delayed through each delay element to be outputted as an input test mode delayed signal tm_i_d. The switching test mode signal tm_s is outputted from each delay detecting target unit 21, . . . , 24 to each switching/latching unit 31, . . . , 34 to control output of the input test mode delayed signal tm_i_d that is inputted to each switching/latching unit 31, . . . , 34. Finally, the output test mode signal tm_o is outputted from each switching/latching unit 31, . . . , 34 to output to each data buffer 61, . . . , 64 to control determination if a signal that is inputted to each output data buffer 61, . . . , 64 should be outputted to each data pad DQ PAD 81, . . . , 84.

Figure 2:
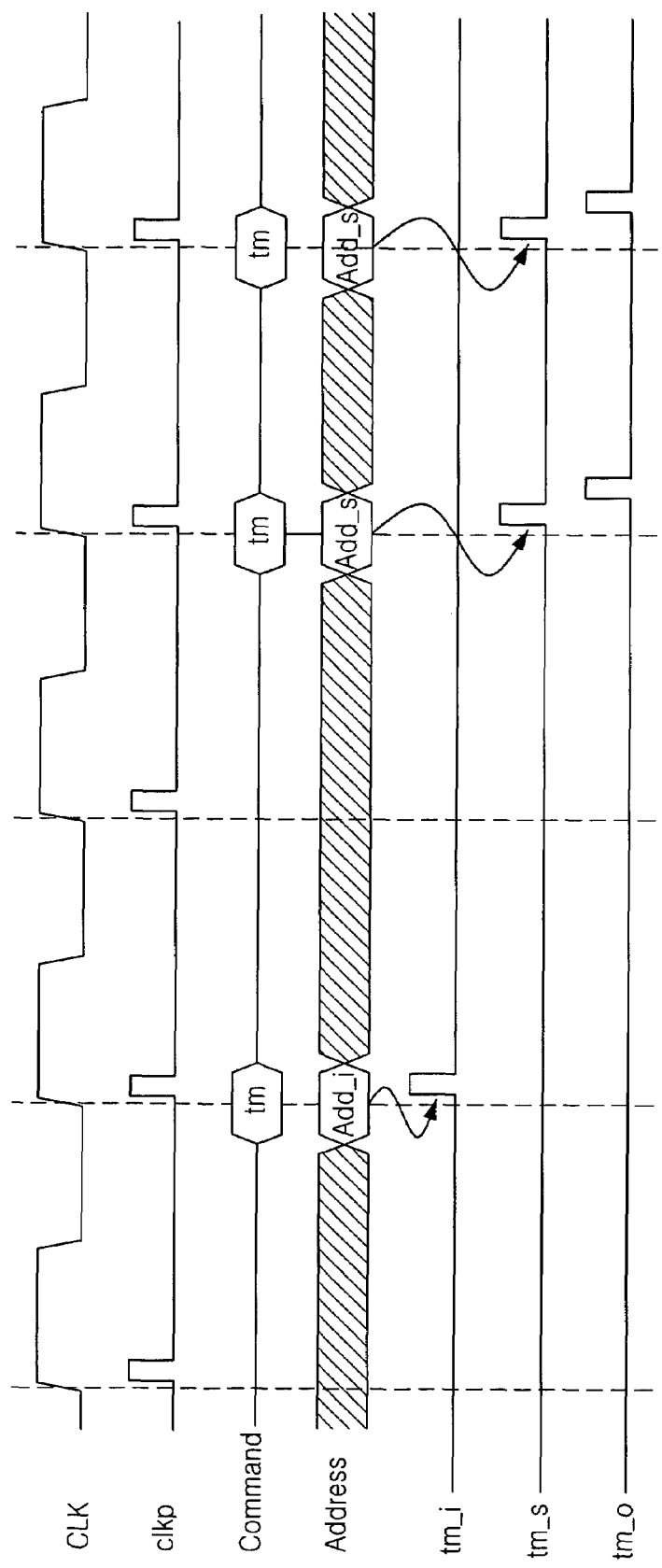
FIG. 2 is an operational timing diagram showing a test mode signal that is applied to each part shown in FIG. 1.

FIG. 2 is an operational timing diagram showing a test mode signal that is applied to each part in FIG. 1.

The input test mode signal tm_i, the switching test mode signal tm_s and the output test mode signal tm_o are generated in synchronization with the pulse clock clkp that is triggered at the rising edge of the external clock. The input test mode signal tm_i may be activated in response to the first pulse clock clkp while the switching test mode signal tm_s may be activated in response to the pulse clock clkp after the first pulse clock clkp.

Figure 3:
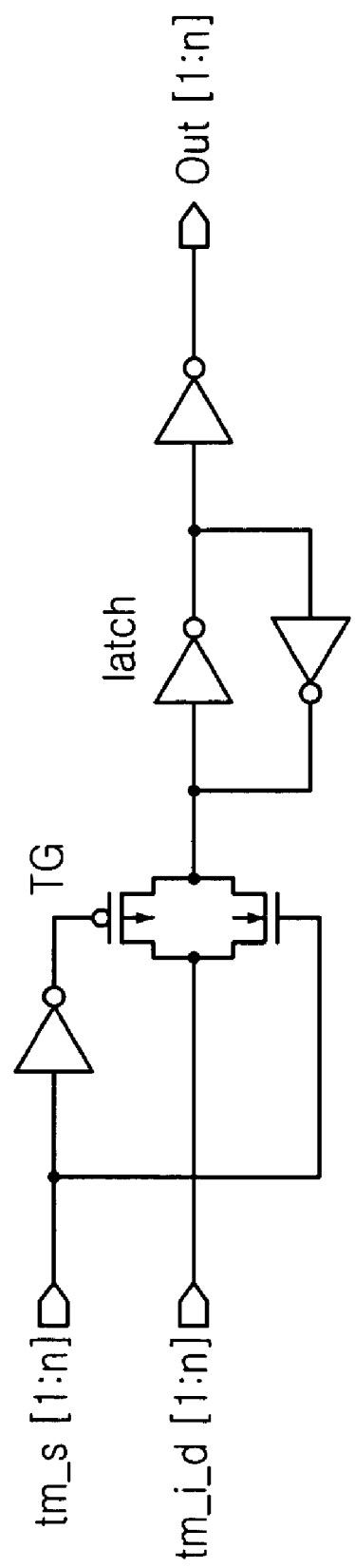
FIG. 3 is a detailed circuit diagram showing a switching/latching unit shown in FIG. 1.

FIG. 3 is a detailed circuit diagram showing a switching/latching unit shown in FIG. 1.

When the switching test mode signal tm_s that is a control signal of a transfer gate TG in each switching/latching unit 31, . . . , 34 turns on the transfer gate TG, the input test mode delayed signal tm_i_d that is inputted to each switching/latching units 31, . . . , 34 is latched and transferred to the data output buffer Dout. A latch in each switching/latching unit 31, . . . , 34 maintains a signal level for the time between input of the output test mode signal tm_o to the data output buffer Dout and output of the signal to the data pad DQ PAD through the transfer gate TG.

Figure 4:
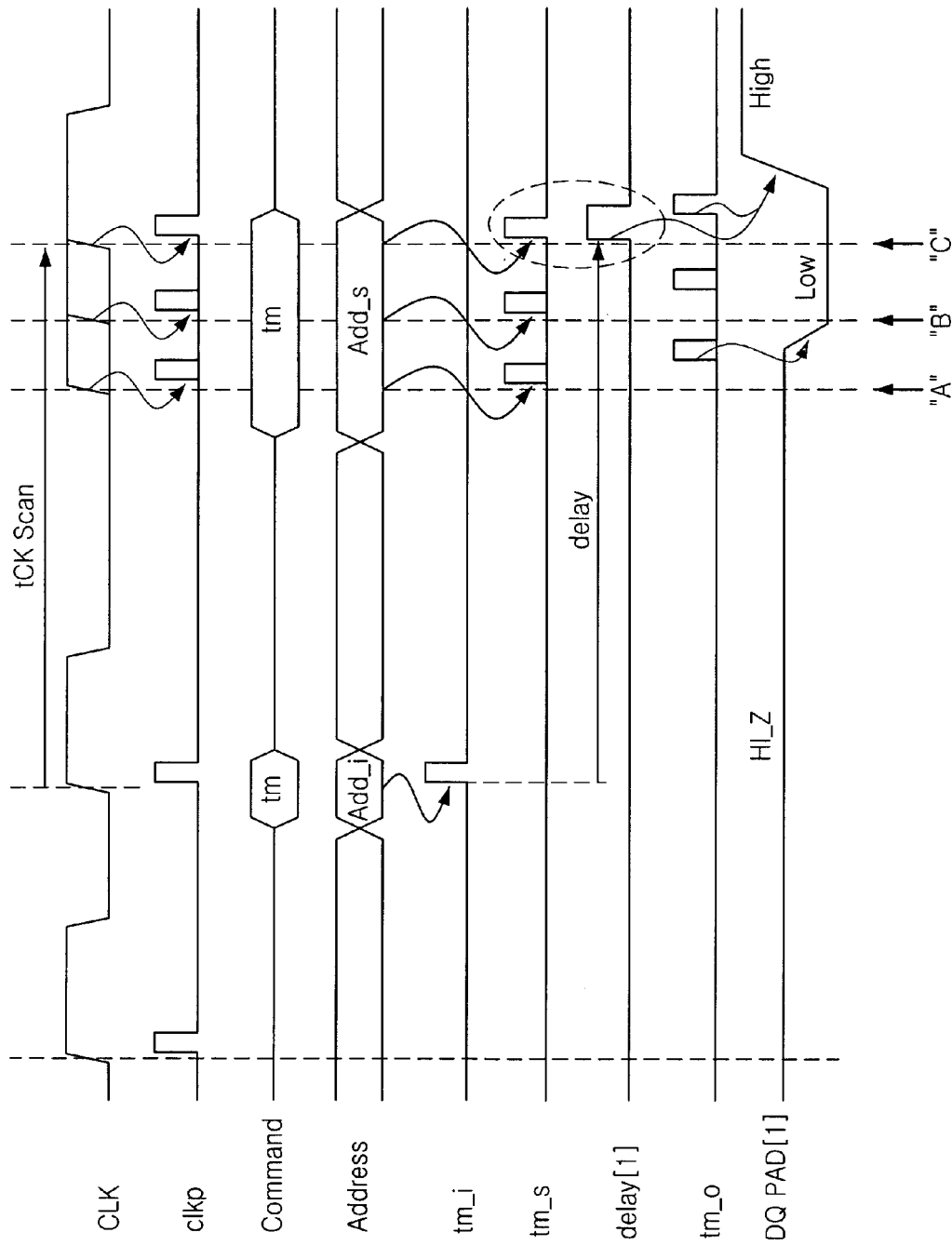
FIG. 4 is an operational timing diagram for each part in accordance with the present invention.

In the present invention, a tCK scanning scheme is used in order to detect the delays of the delay elements, which will be described with reference to an operational timing diagram for each part in accordance with an embodiment of the present invention as shown in FIG. 4.

First, the rising time of the first clock is maintained constantly. However, the rising time of the second clock may be increased or decreased by a predetermined time to generate the pulse clock clkp. When the command Command and the address Address are inputted in synchronization with the second pulse clock clkp, the input test mode signal tm_i and the switching test mode signal tm_s can be generated.

At this point, if tCK is varied, the input test mode signal tm_i shows same timing because of the constant first clock timing while the switching test mode signal tm_s shows discrete feature based on tCK scan steps as shown in FIG. 4.

When the timing when the switching test mode signal tm_s is activated and the timing when the input test mode signal tm_i_d are equal to each other, the input test mode delayed signal tm_i_d is outputted to the transfer gate TG. To the contrary, even if the switching test mode signal tm_s is activated, there is no activated signal at the output of the switching/latching unit when the input test mode delayed signal tm_i_d is not activated.

For example, assuming the output of the switching/latching unit Switch&Latch[1] corresponding to the first address is referred to as delay[1], the operational timing can be represented as shown in FIG. 4. At this point, due to the delay between the output test mode signal tm_o and the switching test mode signal tm_s, the signal delay[1] is isolated within the latch causing longer duration of the signal.

If the output test mode signal tm_s is not activated, the data pad DQ PAD has high impedance Hi-Z, i.e., open state. To the contrary, when the output test mode signal tm_s is activated, the output of the switching/latching unit that is inputted to the data output buffer Dout is transferred to the data pad DQ PAD.

On the other hand, if the output of the switching/latching unit is not activated, the output of the data pad DQ PAD becomes "L" state while, if activated, the output of the data pad DQ PAD becomes "H" state. Accordingly, at the timing that is equal to the delay of the delay detecting target unit in tCK scan, the data pad DQ PAD shows "H" state. Otherwise, the data pad DQ PAD shows "L" state.

As seen in FIG. 1, since each of the delay elements has separate data pad DQ PAD and all the pipelines for the test mode signals, e.g., 12, 42, 72, have same delay values, it is possible to detect the delays of the delay elements in the delay detecting target units in one tCK scan. This means that it is possible to detect accurately the delays of the delay elements in the semiconductor memory device in relatively short time.

According to the present invention, it is capable of accurately detecting the delays of the delay elements in the semiconductor memory device and is facilitated to resolve the problems in semiconductor memory device design by using the detected accurate data. Further, it is able to significantly reduce time for designing the semiconductor memory device.

The present invention is capable of detecting the delays of the delay detecting target units at the data pad DQ PAD and, accordingly, of being applied to a probe test such that time and cost for the test can be reduced.

The present application contains subject matter related to the Korean patent application No. KR 2004-24031, filed in the Korean Patent Office on Apr. 8, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor device comprising:
    a delay signal detecting unit for detecting delays of delay detecting target units in the semiconductor device by using a signal that is synchronized with an external clock; and
    a delay signal outputting unit for outputting delayed signals from the delay signal detecting unit respectively corresponding to the delay detecting target units, to data pads by using the signal that is synchronized with the external clock;
    wherein the delay signal detecting unit includes:
    a test mode signal generating unit for receiving a command signal, an address signal and a pulse clock that is synchronized with the external clock to generate a plurality of test mode signals;
    a plurality of the delay target units, each including one or more delay elements; and
    a plurality of switching/latching units for controlling output of the delayed signals that are outputted from the corresponding delay detecting target units by using one of the plurality of the test mode signals.

2. The semiconductor device as recited in claim 1, wherein the plurality of test mode signals includes:
    an input test mode signal that is inputted to the delay detecting target units to output a delayed input test mode signal;
    a switching test mode signal for controlling the switching/latching units; and
    an output test mode signal for controlling the delay signal outputting unit;
    wherein the input test mode signal, the switching test mode signal, and the output test mode signal are generated in synchronization with the pulse clock generated in synchronism with the external clock.

3. The semiconductor device as recited in claim 2, wherein each of the switching/latching units includes:
    a transfer gate for transferring the delayed input test mode signal under control of the switching test mode signal; and
    a latch for latching the output of the transfer gate.

4. The semiconductor device as recited in claim 3, wherein the input test mode signal is activated in response to a first pulse of the pulse clock, the switching test mode signal is activated in response to remaining pulses of the pulse clock, and an interval between the first pulse of the pulse clock and remaining pulses is adjustable.

5. The semiconductor device as recited in claim 4, wherein delay amounts of pipelines that transfer the input test mode signal and the switching test mode signal are equal to each other.

6. The semiconductor device as recited in claim 3, wherein delay amounts of pipelines that transfer the input test mode signal and the switching test mode signal are equal to each other.

7. The semiconductor device as recited in claim 2, wherein delay amounts of pipelines that transfer the input test mode signal and the switching test mode signal are equal to each other.

8. A method for detecting delays of delay elements in a semiconductor device, comprising:
    detecting delay signals that are generated by delay detecting target units in the semiconductor device by using a signal that is synchronized with an external clock; and
    outputting the delayed signals that are detected in the detecting step to a data pad by using the signal that is synchronized with the external clock;
    wherein the detecting of the delay signals includes:
    generating a plurality of test mode signals after receiving a command signal, an address signal and a pulse clock that is synchronized with the external clock, the plurality of the test mode signals including an input test mode signal, a switching test mode signal and an output test mode signal;
    outputting input test mode delayed signals that are generated by passing the input test mode signal through the delay detecting target units; and
    controlling the output of the input test mode delayed signals by using the switching test mode signal.

9. The method as recited in claim 8, wherein the input test mode signal, the switching test mode signal and the output test mode signal are generated in synchronization with the pulse clock that is synchronized with the external clock.

10. The method as recited in claim 9, wherein the input test mode signal is activated in response to a first pulse of the pulse clock, the switching test mode signal is activated in response to remaining pulses of the pulse clock, and an interval between the first pulse and the remaining pulses of the pulse clock is adjustable.

* * * * *